United States Patent [19]

Joseph et al.

[11] Patent Number: 4,754,259

[45] Date of Patent: Jun. 28, 1988

[54] ANGLE DIGITIZER WITH ENHANCED HARMONIC REJECTION

[75] Inventors: James D. Joseph, Oakdale; Dennis D. Ferguson, St. Paul, both of Minn.

[73] Assignee: Honeywell Inc., Minneapolis, Minn.

[21] Appl. No.: 24,659

[22] Filed: Mar. 11, 1987

[51] Int. Cl.[4] .......................................... H03M 1/64
[52] U.S. Cl. ............................ 340/347 SY; 324/83 D
[58] Field of Search ............... 340/347 P, 347 SY; 324/83 D, 83 Q

[56] References Cited

U.S. PATENT DOCUMENTS

| 4,277,748 | 7/1981 | Gerst et al. |  |
|---|---|---|---|
| 4,405,895 | 9/1983 | Gerst | 324/83 D |
| 4,426,620 | 1/1984 | Buchenauer | 324/83 D |

Primary Examiner—Charles D. Miller
Attorney, Agent, or Firm—William T. Udseth; John G. Shudy, Jr.

[57] ABSTRACT

A device for converting time varying signals which represent $\sin \theta$ and $\cos \theta$ of an angle $\theta$, where can take on values over a range, to an n bit digital signal. The range is typically $2\pi$ radians and is segmented into $2^{n+1}-4$ segments. The segments are mapped into $2^n-1$ amplitudes, and are encoded as the n bit digital signal. The invention is particularly useful as an angle digitizer where $\theta$ represents the phase difference between an input signal and a reference signal. As an angle digitizer, harmonic rejection is enhanced by the efficient use of the n bits to distinguish amplitude states as opposed to distinguishing merely phase states.

8 Claims, 3 Drawing Sheets

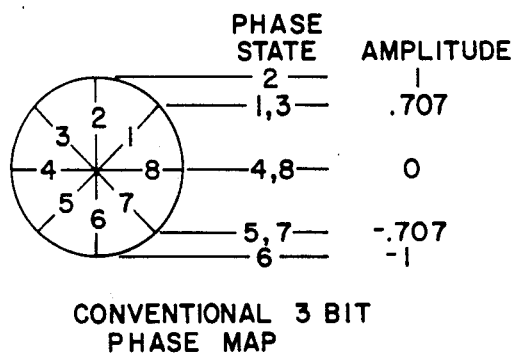
Fig. 1a — CONVENTIONAL 3 BIT PHASE MAP
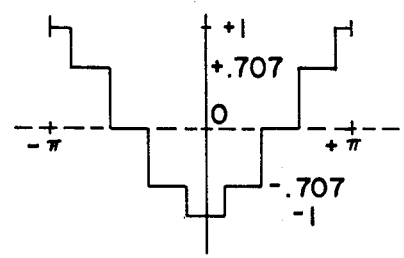
Fig. 1b — CONVENTIONAL 3 BIT TIME WAVEFORM
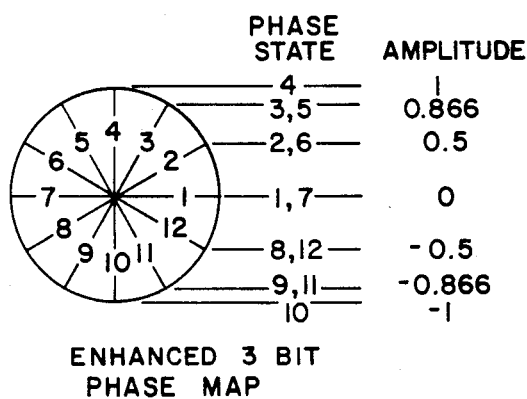
Fig. 2a — ENHANCED 3 BIT PHASE MAP
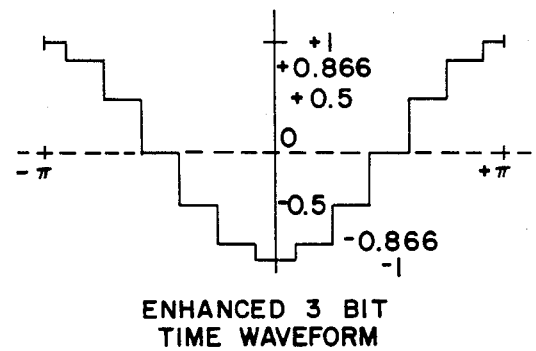
Fig. 2b — ENHANCED 3 BIT TIME WAVEFORM
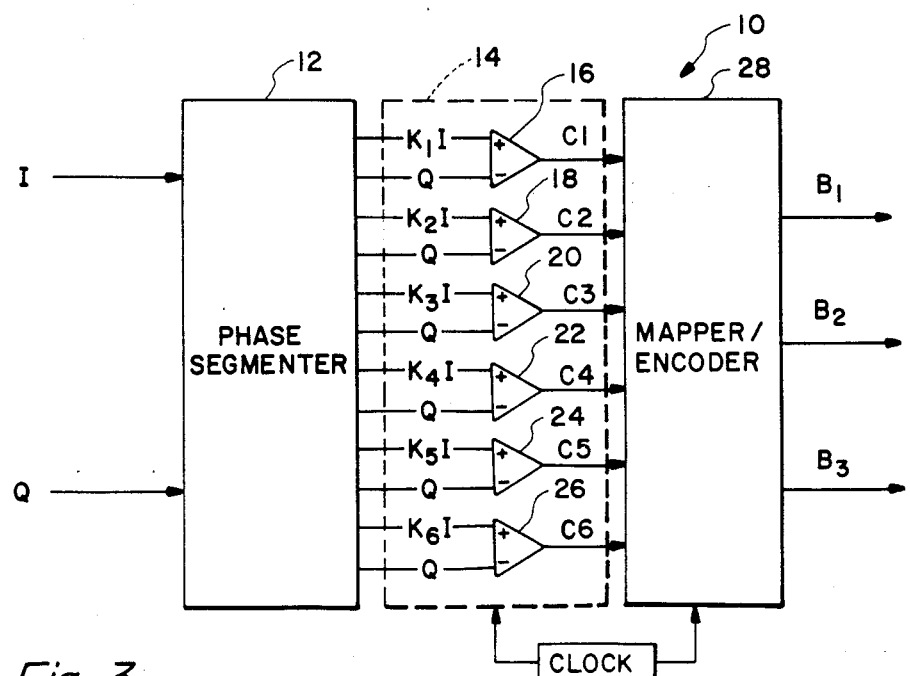
Fig. 3

ENCODER

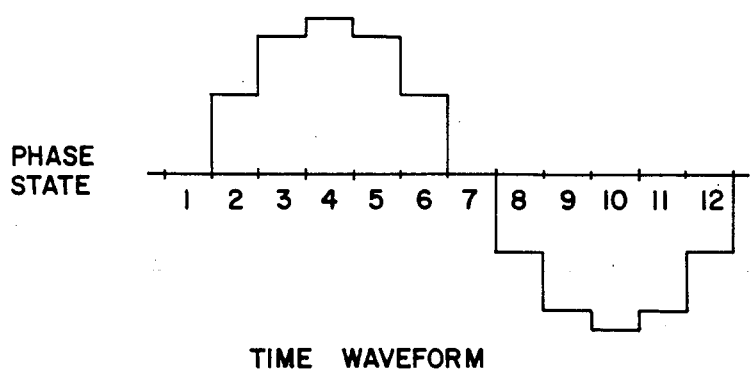
*Fig. 5a*
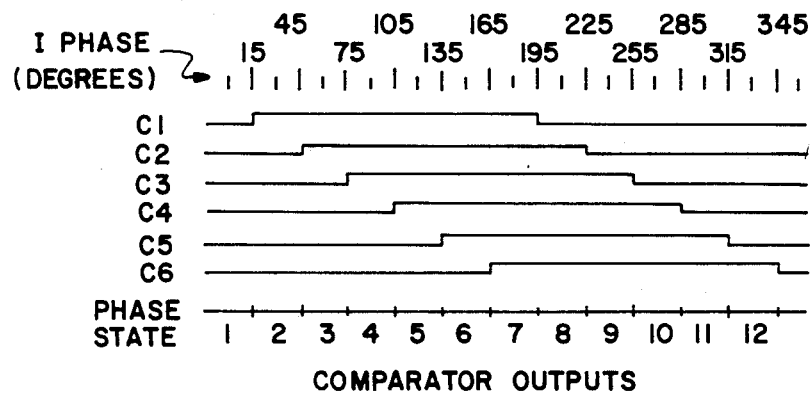
*Fig. 5b*
| COMPARATOR OUTPUT | | | | | | ENCODER OUTPUT | | | PHASE STATE | AMP STATE |
|---|---|---|---|---|---|---|---|---|---|---|
| C6 | C5 | C4 | C3 | C2 | C1 | B3 | B2 | B1 | | |
| 0 | 0 | 0 | 0 | 0 | 0 | 1 | 1 | 0 | 1 | Ā |
| 0 | 0 | 0 | 0 | 0 | 1 | 0 | 1 | 1 | 2 | B |
| 0 | 0 | 0 | 0 | 1 | 1 | 0 | 1 | 0 | 3 | C |
| 0 | 0 | 0 | 1 | 1 | 1 | 1 | 1 | 1 | 4 | D |
| 0 | 0 | 1 | 1 | 1 | 1 | 0 | 1 | 0 | 5 | C |
| 0 | 1 | 1 | 1 | 1 | 1 | 0 | 1 | 1 | 6 | B |
| 1 | 1 | 1 | 1 | 1 | 1 | 1 | 0 | 0 | 7 | A |
| 1 | 1 | 1 | 1 | 1 | 0 | 0 | 0 | 1 | 8 | E |
| 1 | 1 | 1 | 1 | 0 | 0 | 0 | 0 | 0 | 9 | F |
| 1 | 1 | 1 | 0 | 0 | 0 | 1 | 0 | 1 | 10 | G |
| 1 | 1 | 0 | 0 | 0 | 0 | 0 | 0 | 0 | 11 | F |
| 1 | 0 | 0 | 0 | 0 | 0 | 0 | 0 | 1 | 12 | E |
*Fig. 7*

ANGLE DIGITIZER WITH ENHANCED HARMONIC REJECTION

BACKGROUND OF THE INVENTION

1. FIELD OF THE INVENTION

This invention relates to analog to digital convertors, and particularly to such convertors where an angle representing the phase difference between two electronic signals is digitized.

2. RELATED ART

In analog to digital conversion, the Nyquist criteria requires one to sample at a rate which is at least twice that of the highest frequency of the analog input signal. In order to reduce the sampling rate, for a limited bandwidth signal, the analog signal can first be translated to a lower frequency range by mixing with a local oscillator without loss of information. This process is called down conversion, and a down converted signal that meets the Nyquist criteria retains both amplitude and phase information. An early phase digitization technique was 1 bit digitization. This technique retained the phase information by squaring the incoming signal at the expense of the amplitude information.

Whether down converted or not, in digitizing the analog signal, fourier analysis of the digital waveform shows that in 1 bit digitization, harmonics of the sampling frequency are generated, but with an amplitude reduced by a factor of $1/m$ of that of the fundamental frequency, where m represents the odd integers from one to infinity and represents multiples of the sampling frequency.

If the analog signal is subsequentially reconstructed from the digitized data, the undesired harmonics introduced by the sampling process are retained. In many applications these harmonics are of no concern due to their reduced amplitude. But for certain applications, the near-in harmonics have sufficient amplitude to cause difficulties.

U.S. Pat. No. 4,277,748 to Gerst, et al. (Gerst) improved harmonic rejection by the use of a phase angle digitizer. A signal $\theta$ representative of the phase differences between an input signal and a reference signal is provided. In-phase (I or $\sin \theta$) and quadrature (Q or $\cos \theta$) signals are generated and fed to "orthogonal" inputs of a bridge circuit. A signal representing the vector sum of $\sin \theta$ and $\cos \theta$ moves around the bridge in response to the instantaneous value of $\theta$. The range of $\theta$ (i.e. $2\pi$ radians in phase space) is segmented by tapping the bridge at points representing various angles in phase space. All values of $\theta$ are available, i.e. phase space in spanned.

Pairs of tapped signals are input to digital comparators to generate a digital signal for each segment in phase space at a given time. Knowing the digital value of $\theta$ at each segment in phase space at a given time, is sufficient to uniquely determine the phase state of $\theta$.

Gerst's device divides phase space into equal segments and outputs a digital bit for each segment. For sixteen segments of 22.5° each, Gerst employs eight comparators and translates the outputs of eight comparators to a four bit signal (the number of bits needed to uniquely identify $\theta$ given sixteen phase segments. Gerst's approach results in a reduction (i.e. rejection) in amplitude of odd harmonics 3, 5, 11 and 13 below the $1/m$ factor of the 1 bit digitization scheme, but the amplitude of odd harmonics 7, 9, 15 and 17 still obeys the $1/m$ scaling rule.

If a three bit signal were employed, the map and time waveform of FIGS. 1a and 1b represent Gerst's phase digitization scheme. Note that eight phase state are possible, each spanning 45° in phase space. Note also that there are only five amplitude states associated with these eight phase states, with all states being unambiguous in phase but three pairs of the states (i.e. states 1, and 3, states 4 and 8, and states 5 and 7) being ambiguous in amplitude.

It is desirable to reduce the number of bits required to achieve a given level of harmonic rejection in digitizers as compared to Gerst and others, or alternatively, improve harmonic rejection for a given number of bits.

SUMMARY OF THE INVENTION

The present invention is a device and method for converting a time varying electronic signal, which represents the phase difference between two signals to an n bit digital signal. This device includes means for dividing the range of possible values of $\theta$ into $2^{n+1} - 4$ segments of, preferably, equal width. In total, these segments span the range. At a given time, a signal amplitude is associated with each segment and there are $2^n - 1$ possible amplitudes.

The device in effect maps the segments into the amplitudes, where there is a one to one correspondence between two of the segments and two of the amplitudes, and pairs of the remaining amplitudes are mapped onto a unique one of the remaining of the amplitudes.

The device further includes a means for providing, at selected times, a segment digital signal for each of the phase segments, where together the segment digital signals represent the phase state of $\theta$.

A means for generating the n bit digital signal based on the amplitude of the segment digital signals is also included.

The invention utilizes the available bits to provide amplitude states, as opposed to dedicating the bits to identifying phase states. This eliminates redundancy inherent in earlier schemes and allows more phase states for a given number of bits. This in turn allows a more accurate representation of $\theta$ and increases harmonic rejection.

BRIEF DESCRIPTION OF THE DRAWINGS

FIGS. 1a and 1b are a conventional phase map and corresponding time waveform, respectively.

FIGS. 2a and 2b are a phase map and corresponding time waveform of the present invention, respectively.

FIG. 3 is a block diagram of an angle digitizer of the present invention.

FIG. 5 is a waveform output from the comparators of FIG. 4 and a table of the comparator outputs.

FIG. 7 is data summarizing the operation of on examplary embodiment of the present invention.

DESCRIPTION OF THE PREFERRED EMBODIMENT

FIGS. 2a and 2b show a phase/amplitude map and the corresponding time waveform of the present invention. The earlier digitization technique represented by FIGS. 1a and 1b utilize the available bits to segment phase space. The present invention recognizes that by utilizing the available bits to provide discrete amplitude levels, the number of phase states can be increased relative to FIG. 1a. This is illustrated in FIG. 2a, where three bits affords seven amplitude states, and due to the symmetry of a sine waveform, this results in twelve phase states.

For n bits, $2^n-1$ amplitude states are available in the present invention. This results, preferably, in $2^{n+1}-4$ phase states. Only the two extreme amplitude states, $\pm 1$, are mapped to a single phase state, and the remainder of the phase states are mapped as pairs to a unique amplitude state (i.e. the amplitude state having a magnitude common to both members of the phase state pair). The paired phase states are determined by inspection of a circular phase map as shown by FIG. 2a, or by noting that the $i^{th}$ pair is separated by $i\pi/2^{n-1}-1$ radians where $i=1, 2 \ldots (2^n-3)$.

FIG. 3 is a schematic of a generalized device 10 for implementing the above method. I and Q are provided, by standard techniques, to phase space segmenter 12. Segmenter 12 segments phase space into $2^{n+1}-4$ segments. FIG. 3 also shows a means 14 for providing a digital signal representation of the phase state of $\theta$ at a selected time, e.g. clocked zero crossing comparators 16, 18, 20, 22, 24 and 26.

Figure 4:
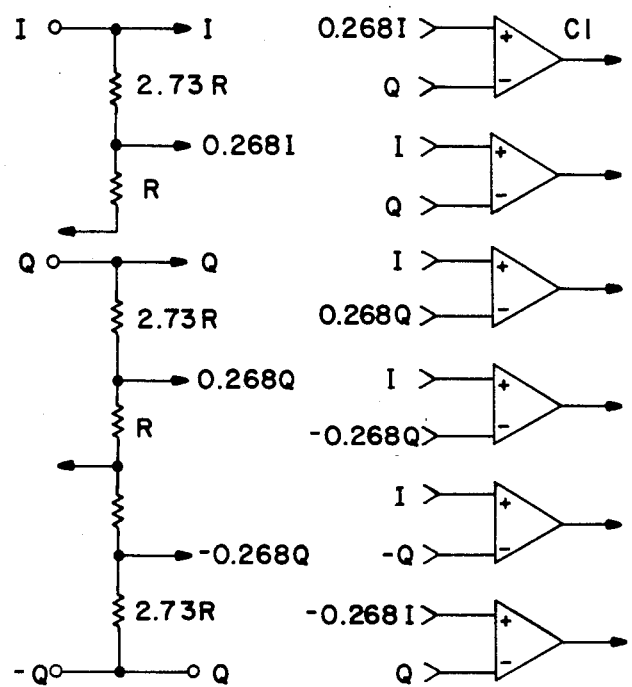
FIG. 4 is a schematic of a suitable phase segmenter of the device of FIG. 3.

FIG. 4 shows a convenient means for accomplishing the segmenting where voltage dividers are used.

The weighting of the resistors in the voltage dividers is determined by noting that to employ zero crossing comparators, one wants $\cos \theta$ and $\sin \theta$ to be equal at the phase transistion points (i.e. phase segment boundaries). That is:

$$k \cos (\pi/s + 2j\pi/s) = \sin (\pi/s + 2j\pi/s) \quad (1),$$

where $s = 2^{n+1} - 4$ and $j = 0, 1, 2 \ldots (s/2 - 1)$. That is s is the number of phase states and j is the number of phase transistion points.

By way of example, in a three bit scheme, there are twelve phase states and six comparators. Using equation 1, k is:

$$k = \tan (\pi/s + 2j\pi/s) \quad (2).$$

Between 0 and $\pi/2$, the transition points are 15°, 45° and 75°. The corresponding values of k are 0.26795, 1 and 3.73205. To simplify the required weighting of comparator inputs, one can weight the I input with 1 and the Q input with 1/k. The results for all angles up to $\pi$ are shown below.

| Comparator | I-Weight | Q-Weight |
|---|---|---|
| 1 | 0.26795 | 1.0 |
| 2 | 1.0 | 1.0 |
| 3 | 1.0 | 0.26795 |
| 4 | −1.0 | 0.26795 |
| 5 | −1.0 | 1.0 |
| 6 | −0.26795 | 1.0 |

Note that FIG. 3 employs a more general form of inputs to the comparators (i.e. unlike FIG. 4 FIG. 3 does not weight I with 1, and Q with 1/k).

After segmenting, the inputs are applied to means 14. If the zero crossing comparator scheme is employed, pairs of tapped signals are input substantially simultaneously to the comparators. More generally, the comparators are examples of digital devices which output a first logic signal if a first input is larger than the second input, and a second logic signal if the second input is larger than the first input. If the inputs are the same, a special signal can be output or one of the two logic states selected as a convention.

The two inputs to a comparator are preferably antiphase, i.e. the phase segments are separated by $\pi$. At selected times (by, for example, an enable or clock signal to the comparators) a comparison of the inputs is made. The comparison is made, in phase space, at intervals equal to the segment width. In the time domain, this is equivalent to clocking the comparators at intervals of $2\pi/\omega$, where $\omega$ is the frequency of the input signal whose phase is being determined. Signals I and Q will have their peaks and zero crossings in different phase segments at the time the comparators are enabled. Each comparator will output a digital signal ($C_1$ to $C_6$) which will provide twelve six bit segment digital signals (one for each segment, see FIG. 7) which together will indicate the phase state of $\theta$.

For the specific case of harmonic manipulation, more general phase inputs to the comparators may be chosen. This will result in a different distribution of harmonics. The closer that the input interval is to antiphase, the more the magnitude of the even harmonics is diminished and the more the magnitude of the odd harmonics is increased. Conversely, the further the input is from antiphase, the more the magnitude of the odd harmonics is reduced and the more the magnitude of the even harmonics is increased.

FIG. 5 shows an example of the time waveform of the phase state of $\theta$ after comparators of FIG. 4 are clocked, with the corresponding bit codes from $C_1$ to $C_6$ below.

Figure 6:
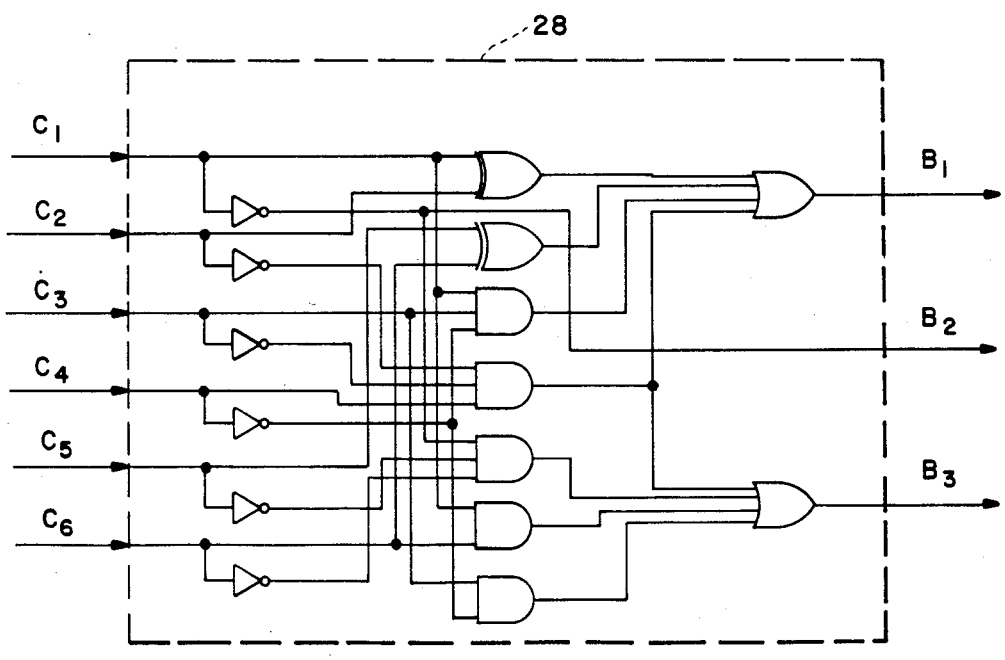
FIG. 6 is an example of a combinational logic circuit suitable as an encoder for the three bit case of the present invention.

FIG. 6 is an example of a combinational logic circuit suitable as an encoder for the three bit case. Of course, other logic encoder circuits can be used.

FIG. 7 summarizes the operation of device 10 for the example of FIG. 5.

Other circuits than the voltage divider of FIG. 4 can be employed. For example, a bridge where the legs are voltage dividers and I and Q orthogonal inputs is suitable.

It is possible to assign a different number of phase states than $2^{n+1}-4$ to the $2^n-1$ amplitude states, but such a device or method will likely be less efficient A significant advantage of this invention over normal analog to digital conversion is that by using I and Q down conversion one can achieve twice the instantaneous bandwidth. In comparsion to normal A to D conversion, phase as well as amplitude information is digitized. More particularly, the frequency of the signal is identified as being either in the upper or lower sideband with respect to the local oscillator. The identification affords the increased bandwidth.

What is claimed is:

1. A device for converting time varying electronic singnals which represent sin and cos of an angle $\theta$, where $\theta$ can take on values over a range, to an n bit digital signal, said device comprising:
   means for segmenting said range into $2^{n+1}-4$ segments in response to said sin $\theta$ and said cos $\theta$ signals;
   means for providing, at selected times, a segment digital signal for each of said segments, wherein each of said segment digital signals represent the state of $\theta$ in the corresponding one of said segments and wherein the amplitude of each of said segment digital signals is one of $2^n-1$ possible amplitudes; and means for encoding said segment digital signals, based on the amplitude of said segment digital signal, as said n bits, to provide said n bit signal.

2. The device of claim 1 wherein said range is $2\pi$ radians.

3. The device of claim 1 wherein n is either 3, 4 or 5.

4. The device of claim 1 wherein said means for providing said segment digital signals includes a plurality of comparators wherein pairs of signals are input to each comparator with said inputs each being proportional to said $\sin \theta$ or to said $\cos \theta$.

5. The device of claim 1 wherein said means for segmenting includes:

a plurality of voltage dividers, wherein signals proportional to either $\sin \theta$ or $\cos \theta$ are input to said voltage dividers and the outputs from said voltage dividers represent weighted functions of said inputs.

6. The device of claim 5 wherein there are s of said outputs and s/2 of said outputs are each weighted by a unique kj according to:

$$k_j = \tan(\pi/s + 2j\pi/s)$$

where $$s = 2^{n+1} - 4 \text{ and } j = 0, 1, 2 \ldots (s/2 - 1).$$

7. The device of claim 6 wherein said means for providing said segment digital signals includes s/2 comparators, wherein a pair of said outputs is applied to each of said comparators, with one of said outputs in each pair being one of said weighted outputs.

8. A method of converting time varying electronic signals which represent $\sin \theta$ and $\cos \theta$ of an angle $\theta$, where $\theta$ can take on values over a range, to an n bit digital signal, said method comprising:

segmenting said range into $2^{n+1} - 4$ segments in response to said $\sin \theta$ and $\cos \theta$ signals;

mapping, at selected times, each of said segments onto an amplitude state, wherein there are $2^n - 1$ amplitude states; and encoding said mapped segments, based on the amplitude state of said segments, as said n bit digital signal.

* * * * *